US012255228B2

(12) United States Patent
Iwaya et al.

(10) Patent No.: US 12,255,228 B2
(45) Date of Patent: Mar. 18, 2025

(54) SILICON CARBIDE SEMICONDUCTOR DEVICE AND METHOD OF MANUFACTURING SILICON CARBIDE SEMICONDUCTOR DEVICE

(71) Applicants: FUJI ELECTRIC CO., LTD., Kawasaki (JP); DENSO CORPORATION, Kariya (JP)

(72) Inventors: Masanobu Iwaya, Matsumoto (JP); Kensuke Hata, Kariya (JP)

(73) Assignees: FUJI ELECTRIC CO., LTD., Kawasaki (JP); DENSO CORPORATION, Kariya (JP)

( * ) Notice: Subject to any disclaimer, the term of this patent is extended or adjusted under 35 U.S.C. 154(b) by 416 days.

(21) Appl. No.: 17/678,661

(22) Filed: Feb. 23, 2022

(65) Prior Publication Data

US 2022/0302251 A1 Sep. 22, 2022

(30) Foreign Application Priority Data

Mar. 19, 2021 (JP) ................................ 2021-045826

(51) Int. Cl.
*H01L 29/15* (2006.01)
*H01L 21/04* (2006.01)
(Continued)

(52) U.S. Cl.
CPC .......... *H01L 29/063* (2013.01); *H01L 21/046* (2013.01); *H01L 21/7602* (2013.01);
(Continued)

(58) Field of Classification Search
CPC ............... H01L 29/063; H01L 29/1095; H01L 29/1608; H01L 29/66068; H01L 29/7813;
(Continued)

(56) References Cited

U.S. PATENT DOCUMENTS 5,473,176 A * 12/1995 Kakumoto ........ H01L 29/66522 257/E21.441
2010/0006861 A1* 1/2010 Yamamoto ............ H01L 29/086 257/77
(Continued)

FOREIGN PATENT DOCUMENTS

JP 2010021175 A 1/2010
JP 2012064658 A 3/2012
(Continued)

OTHER PUBLICATIONS

Japanese Office Action dated Jul. 2, 2024, in the counterpart Japanese Patent Application No. 2021-045826.

*Primary Examiner* — Tan N Tran
(74) *Attorney, Agent, or Firm* — Rabin & Berdo, P.C.

(57) ABSTRACT

A silicon carbide semiconductor device includes, on a front surface of a silicon carbide semiconductor substrate of a first conductivity type, a first semiconductor layer of the first conductivity type, a second semiconductor layer of a second conductivity type, a third semiconductor layer of the first conductivity type, a first semiconductor region of the first conductivity type selectively provided on a first side of the third semiconductor layer opposite to a second side thereof facing the silicon carbide semiconductor substrate, second semiconductor regions of the second conductivity type that have an impurity concentration higher than that of the second semiconductor layer, trenches, gate electrodes provided via gate insulating films, an interlayer insulating film, a first electrode, and a second electrode. The first semiconductor region is thinner than a portion of the third semiconductor layer between the first semiconductor region and the second semiconductor layer.

9 Claims, 7 Drawing Sheets

(51) Int. Cl.

| | |
|---|---|
| ***H01L 21/76*** | (2006.01) |
| ***H01L 21/761*** | (2006.01) |
| ***H01L 29/06*** | (2006.01) |
| ***H01L 29/10*** | (2006.01) |
| ***H01L 29/16*** | (2006.01) |
| ***H01L 29/66*** | (2006.01) |
| ***H01L 29/78*** | (2006.01) |

(52) U.S. Cl.

CPC ........ *H01L 21/761* (2013.01); *H01L 29/1095* (2013.01); *H01L 29/1608* (2013.01); *H01L 29/66068* (2013.01); *H01L 29/7813* (2013.01)

(58) Field of Classification Search

CPC . H01L 29/086; H01L 21/046; H01L 21/7602; H01L 21/761; H01L 29/7825; H01L 29/66613–66628; H01L 29/42336; H01L 29/42352; H01L 29/4236

USPC .......................................................... 257/77

See application file for complete search history.

(56) References Cited

U.S. PATENT DOCUMENTS

| | | | | |
|---|---|---|---|---|
| 2012/0061682 | A1 | 3/2012 | Yamamoto | |
| 2015/0115286 | A1* | 4/2015 | Takeuchi | H01L 29/158 257/77 |
| 2016/0005826 | A1* | 1/2016 | Uchida | H01L 29/513 438/589 |
| 2016/0133741 | A1* | 5/2016 | Matsuki | H01L 29/66068 257/77 |
| 2017/0271507 | A1* | 9/2017 | Suzuki | H01L 29/167 |
| 2018/0040688 | A1* | 2/2018 | Kobayashi | H01L 29/0623 |
| 2020/0203482 | A1 | 6/2020 | Kaji et al. | |

FOREIGN PATENT DOCUMENTS

| | | | |
|---|---|---|---|
| JP | 2018022851 | A | 2/2018 |
| JP | 2019-046909 | A | 3/2019 |
| JP | 2020-141130 | A | 9/2020 |

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2021-045826, filed on Mar. 19, 2021, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Conventionally, there are silicon carbide semiconductor devices having a trench gate structure as a structure that increases channel density so that large current is passed. A structure of a conventional silicon carbide semiconductor device is described taking a trench-type metal-oxide-semiconductor field-effect transistor (MOSFET) as an example. FIG. 13 is a cross-sectional view depicting the structure of the conventional silicon carbide semiconductor device. FIG. 13 depicts the structure of an active region through which current flows in an ON state. As depicted in FIG. 13, in a trench-type MOSFET 170, a first $n^-$-type silicon carbide epitaxial layer 102 constituting a first n-type drift layer is deposited on a front surface of an $n^+$-type silicon carbide substrate 101.

In the structure, a p-type base layer 106 and $n^+$-type source regions 108 are sequentially formed on the first $n^-$-type silicon carbide epitaxial layer 102, and trench gates configured by trenches 110, gate insulating films 111, and gate electrodes 112 are formed so as to penetrate the p-type base layer 106 from surfaces of the $n^+$-type source regions 108 and reach the first $n^-$-type silicon carbide epitaxial layer 102. In particular, after the p-type base layer 106 is epitaxially grown on the first $n^-$-type silicon carbide epitaxial layer 102, the p-type base layer 106 is ion-implanted with an n-type impurity and inverted, whereby portions of the p-type base layer 106 is inverted to an n-type, thereby forming the $n^+$-type source regions 108.

In FIG. 13, reference numerals 103, 109, 113, 114, and 115 are first $p^+$-type regions, $p^{++}$-type contact regions, an interlayer insulating film, a source pad, and a drain electrode, respectively.

Here, a depth of the ion implantation has less than 5% variation whereas a thickness of an epitaxial growth layer has variation exceeding 10%. In the configuration described above, up to the surface is constituted by a p-type epitaxial layer formed by epitaxial growth and therefore, a thickness of the p-type epitaxial layer is large and a thickness of the p-type base layer 106 varies. This variation directly leads to variation of channel length (the thickness of the p-type base layer 106) and as a result, a problem arises in that threshold voltage fluctuates.

A silicon carbide semiconductor device for solving this problem has been proposed. FIG. 14 is a cross-sectional view depicting another structure of a conventional silicon carbide semiconductor device. In a trench-type MOSFET 171 depicted in FIG. 14, p-type thin-thickness epitaxial growth is performed, thereby, forming the p-type base layer 106, n-type source regions 107 are formed thereon by n-type epitaxial growth of a low impurity concentration (about $1\times10^{17}/cm^3$), and the $n^+$-type source regions 108 are formed on the n-type source regions 107 by $n^+$-type epitaxial growth of a high impurity concentration (at least $5\times10^{18}/cm^3$) (for example, refer to Japanese Laid-Open Patent Publication No. 2019-46909). According to this method, the p-type base layer 106 is formed by p-type thin-thickness epitaxial growth and therefore, variation of the thickness of the p-type base layer 106 decreases. The channel length is determined by a p-type epitaxial growth layer having a thin thickness (about 0.4 μm) and therefore, variation of the channel length may be reduced to a greater extent than that of the configuration in FIG. 13 and variation of the threshold voltage may be suppressed.

In FIG. 14, reference numerals 104, 105, and 109*a* are a second $n^-$-type silicon carbide epitaxial layer, second $p^+$-type regions, and $p^+$-type contact regions.

SUMMARY OF THE INVENTION

According to an embodiment of the invention, a silicon carbide semiconductor device, includes a silicon carbide semiconductor substrate of a first conductivity type, having a first surface and a second surface opposite to each other; a first semiconductor layer of the first conductivity type, provided on the first surface of the silicon carbide semiconductor substrate, the first semiconductor layer having an impurity concentration lower than an impurity concentration of the silicon carbide semiconductor substrate, the first semiconductor layer having a first surface and a second surface opposite to each other, the second surface of the first semiconductor layer facing the silicon carbide semiconductor substrate a second semiconductor layer of a second conductivity type, provided on the first surface of the first semiconductor layer, the second semiconductor layer having a first surface and a second surface opposite to each other, the second surface of the second semiconductor layer facing the silicon carbide semiconductor substrate; a third semiconductor layer of the first conductivity type, selectively provided at the first surface of the second semiconductor layer, the third semiconductor layer having a first surface and a second surface opposite to each other, the second surface facing the silicon carbide semiconductor substrate; a first semiconductor region of the first conductivity type, selectively provided at the first surface of the third semiconductor layer; a plurality of second semiconductor regions of the second conductivity type, selectively provided in the third semiconductor layer, the second semiconductor regions penetrating through the third semiconductor layer from the first surface of the third semiconductor layer, and having an impurity concentration higher than an impurity concentration of the second semiconductor layer; a trench penetrating through the first semiconductor region, the second semiconductor layer, and the third semiconductor layer, and reaching the first semiconductor layer; a gate electrode provided in the trench via a gate insulating film; an interlayer insulating film provided on the gate electrode; a first electrode provided on the first surface of the second semiconductor layer and a surface of the first semiconductor region; and a second electrode provided on the second surface of the silicon carbide semiconductor substrate. The first semiconductor region is thinner than a portion of the third semiconductor layer that is between the first semiconductor region and the second semiconductor layer.

Objects, features, and advantages of the present invention are specifically set forth in or will become apparent from the following detailed description of the invention when read in conjunction with the accompanying drawings.

DETAILED DESCRIPTION OF THE INVENTION

Figure 14:
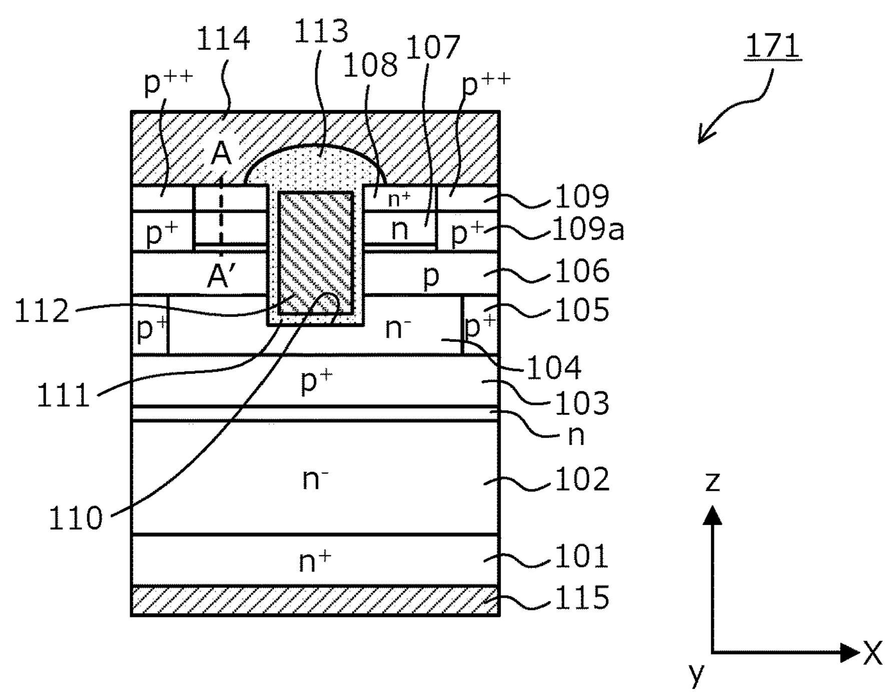
FIG. 14 is a cross-sectional view depicting another structure of a conventional silicon carbide semiconductor device.

First, problems associated with the conventional techniques are discussed. In the conventional structure depicted in FIG. 14, the n-type source regions 107 and the $n^+$-type source regions 108 are formed by epitaxial growth and therefore, a problem arises in that variation of the n-type impurity concentration is large, about 50%, while variation of contact resistance of the n-type source regions 107 and the $n^+$-type source regions 108 and thus variation of the ON resistance increase. A further problem is that there is no method of evaluating the epitaxial growth layer of a high impurity concentration of at least $5\times10^{18}/cm^3$. Moreover, a problem arises in that due to a history when the epitaxial growth of a high impurity concentration is performed, in the next batch, a greater amount of dopant is taken in than expected.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

Figure 1:
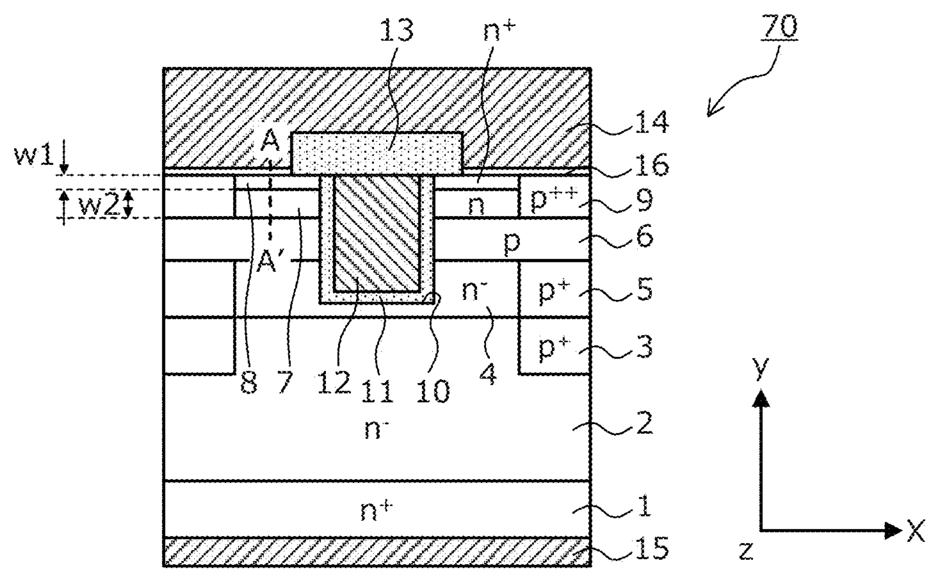
FIG. 1 is a cross-sectional view depicting a structure of a silicon carbide semiconductor device according to an embodiment.

A semiconductor device according to the invention contains a wide band gap semiconductor. In an embodiment, for example, a silicon carbide semiconductor device fabricated (manufactured) using silicon carbide (SiC) as a wide band gap semiconductor is described taking a trench-type MOSFET 70 as an example. FIG. 1 is a cross-sectional view depicting a structure of the silicon carbide semiconductor device according to the embodiment.

As depicted in FIG. 1, the trench-type MOSFET 70 includes metal-oxide-semiconductor (MOS) gates having a trench gate structure in a semiconductor substrate, at a front surface of the semiconductor substrate (surface on a side having later-described p-type base layer 6). In a silicon carbide semiconductor base, a first $n^-$-type silicon carbide epitaxial layer (first semiconductor layer of the first conductivity type) 2 is sequentially grown epitaxially on an $n^+$-type silicon carbide substrate (silicon carbide semiconductor substrate of a first conductivity type) 1 containing silicon carbide. Further, a second $n^-$-type silicon carbide epitaxial layer 4 may be epitaxially grown on the first $n^-$-type silicon carbide epitaxial layer 2. Hereinafter, the $n^+$-type silicon carbide substrate 1, the p-type base layer 6, the first $n^-$-type silicon carbide epitaxial layer 2, and the second $n^-$-type silicon carbide epitaxial layer 4 combined are assumed as the silicon carbide semiconductor base (semiconductor substrate containing silicon carbide).

The MOS gates having a trench gate structure are configured by the p-type base layer (second semiconductor layer of a second conductivity type) 6, an n-type source region (third semiconductor layer of the first conductivity type) 7, $n^+$-type source regions (first semiconductor region of the first conductivity type) 8, $p^{++}$-type contact regions (second semiconductor regions of the second conductivity type) 9, trenches 10, gate insulating films 11, and gate electrodes 12. The p-type base layer 6, for example, has a film thickness in a range from 0.4 μm to 0.6 μm and an impurity concentration in a range from $5.0\times10^{18}/cm^3$ to $2.0\times10^{18}/cm^3$. Preferably, the p-type base layer 6 may have an impurity concentration in a range from $1\times10^{17}/cm^3$ to $5\times10^{17}/cm^3$.

In particular, the trenches 10 penetrate through the p-type base layer 6 in a depth direction y from the front surface of the semiconductor substrate and reach the second $n^-$-type silicon carbide epitaxial layer 4 (in an instance in which the second $n^-$-type silicon carbide epitaxial layer 4 is omitted, the first $n^-$-type silicon carbide epitaxial layer 2, hereinafter, indicated as simply "(2)"). The depth direction y is a direction from the front surface to the back surface of the semiconductor substrate. The trenches 10, for example, are disposed in a striped pattern.

In the trenches 10, the gate insulating films 11 are provided along inner walls of the trenches 10, respectively, and on the gate insulating films 11, the gate electrodes 12 are provided so as to be embedded in the trenches 10, respectively. One unit cell of a main semiconductor device element is configured by the gate electrode 12 of one of the trenches 10 and adjacent mesa regions facing each other across said gate electrode 12 (a mesa region being a region between an adjacent two of the trenches 10). In FIG. 1, while only one trench MOS structure is depicted, further MOS gate (insulated gate formed by a metal, an oxide film, and a semiconductor) structures with the trench structure may be further disposed in parallel.

In the first $n^-$-type silicon carbide epitaxial layer 2, at a source side thereof (side facing later-described source electrodes 16), an n-type region (hereinafter, the second $n^-$-type silicon carbide epitaxial layer) 4 may be provided so as to be in contact with the p-type base layer 6. The second $n^-$-type silicon carbide epitaxial layer 4 is a so-called current spreading layer (CSL) that reduces carrier spreading resistance. The second $n^-$-type silicon carbide epitaxial layer 4, for example, is provided uniformly in a direction parallel to a substrate front surface (the front surface of the semiconductor substrate) so as to circumfuse the inner walls of the trenches 10. The second $n^-$-type silicon carbide epitaxial layer 4 is provided from a border with the p-type base layer 6 to a position closer to a drain side (later-described drain electrode 15) than are bottoms of the trenches 10.

In a surface layer of the first $n^-$-type silicon carbide epitaxial layer 2, first $p^+$-type regions 3 may be selectively provided. Each of the first $p^+$-type regions 3 is disposed between a corresponding adjacent two of the trenches 10. In the second $n^-$-type silicon carbide epitaxial layer 4, second $p^+$-type regions 5 may be selectively provided. The second $p^+$-type regions 5 penetrate through the second $n^-$-type silicon carbide epitaxial layer 4 at respective positions facing the first $p^+$-type regions 3 in the depth direction such that bottoms of the second $p^+$-type regions 5 are in contact with the first $p^+$-type regions 3, respectively, and upper surfaces of the second $p^+$-type regions 5 are in contact with the p-type base layer 6. Through the second $p^+$-type regions 5, the p-type base layer 6 and the first $p^+$-type regions 3 are electrically connected.

The p-type base layer 6 is provided on the surfaces of the second $n^-$-type silicon carbide epitaxial layer 4 and the second $p^+$-type regions 5. The p-type base layer 6 is a p-type epitaxial layer free of ion implantation. The p-type base layer 6 may be formed by ion-implanting a p-type impurity in an n-type epitaxial layer. At the surface of the p-type base layer 6, the n-type source region 7 is provided. The n-type source region 7 is an n-type epitaxial layer free of ion implantation. In the n-type source region 7, the $n^+$-type source regions 8 and the $p^{++}$-type contact regions 9 are selectively provided. In the n-type source region 7 at a first surface thereof opposite to a second surface thereof facing the $n^+$-type silicon carbide substrate 1, the $n^+$-type source regions 8 are provided. The n-type source region 7 and the $n^+$-type source regions 8 are in contact with the gate insulating films 11 at sidewalls of the trenches 10 and face the gate electrodes 12 across the gate insulating films 11 at the sidewalls of the trenches 10. In the n-type source region 7, the $p^{++}$-type contact regions 9 that penetrate through the n-type source region 7 and reach the p-type base layer 6 are provided. The $p^{++}$-type contact regions 9 are in contact with the n-type source region 7 and the $n^+$-type source regions 8. The $p^{++}$-type contact regions 9 have an impurity concentration that is higher than the impurity concentration of the p-type base layer 6.

The n-type source region 7 is provided closer to the drain side than are the $n^+$-type source regions 8; and the n-type source region 7 and the $n^+$-type source regions 8 are in contact with each other. The n-type source region 7 and the $n^+$-type source regions 8 have substantially equal widths. In a portion of the $n^+$-type source regions 8, the thickness of the $n^+$-type source regions 8 is less than the thickness of the n-type source region 7 of portions between the p-type base layer 6 and the $n^+$-type source regions 8.

Figure 2:
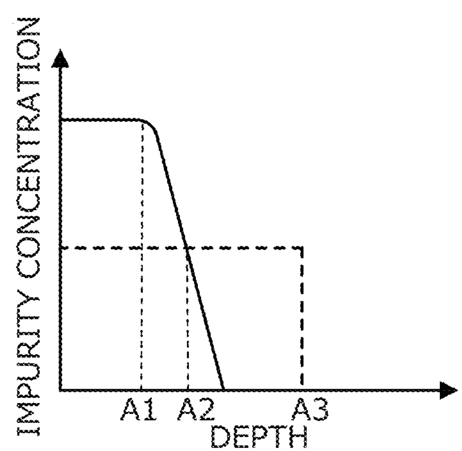
FIG. 2 is a graph of an impurity concentration profile of a portion A-A' of a conventional silicon carbide semiconductor device.
Figure 3:
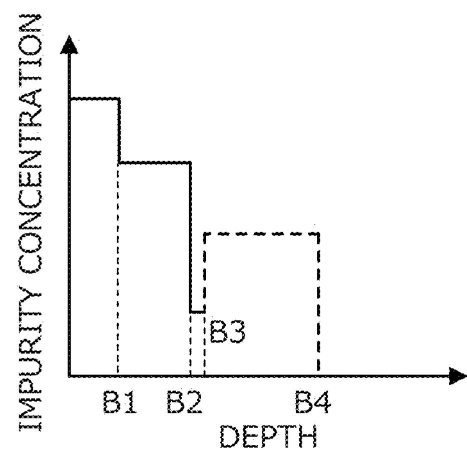
FIG. 3 is a graph of an impurity concentration profile of the portion A-A' of another conventional silicon carbide semiconductor device.
Figure 13:
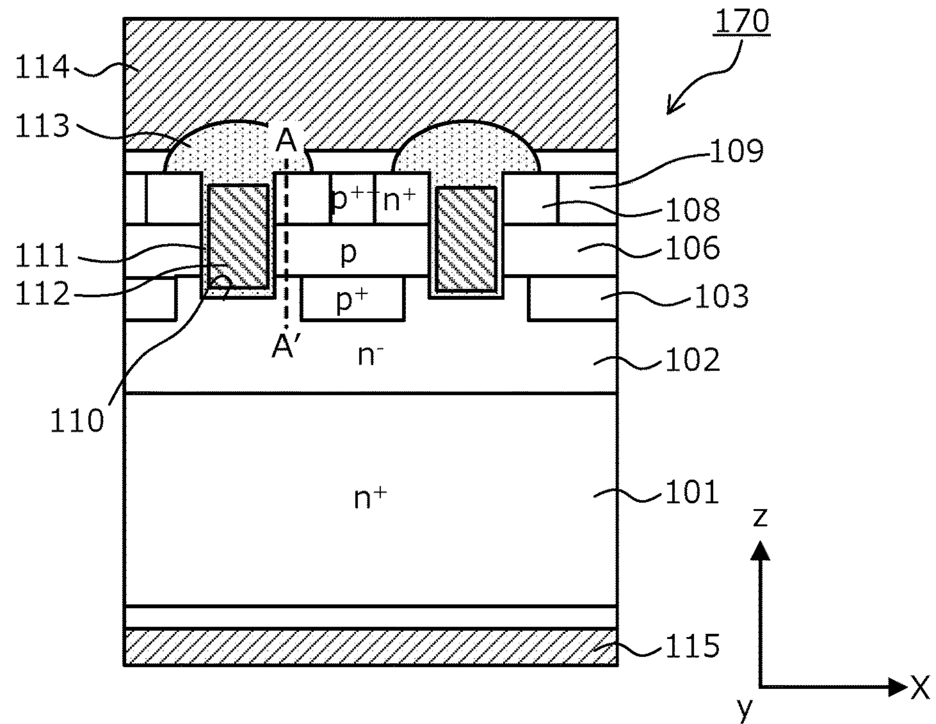
FIG. 13 is a cross-sectional view depicting a structure of a conventional silicon carbide semiconductor device.

FIGS. 2 and 3 are graphs of impurity concentration profiles of a portion A-A' of the conventional silicon carbide semiconductor device. FIG. 2 is for an instance of the conventional silicon carbide semiconductor device depicted FIG. 13 and FIG. 3 is for an instance of the conventional silicon carbide semiconductor device depicted in FIG. 14. In FIGS. 2 and 3, a horizontal axis indicates depth from the surface of the silicon carbide semiconductor base while a vertical axis is an n-type or a p-type impurity concentration, where the n-type impurity concentration is indicated by a solid line and the p-type impurity concentration is indicated by a dashed line.

In FIG. 2, the $n^+$-type source regions 108 are to a depth A2 while the p-type base layer 106 is to a depth A3. In the conventional silicon carbide semiconductor device depicted in FIG. 13, the $n^+$-type source regions 108 are formed by multiple sessions of ion implantation and therefore, the n-type impurity concentration is substantially constant to a depth A1, and from the depth A1 to the depth A2, the n-type impurity concentration sharply decreases. Further, the p-type base layer 106 is formed to the surface by epitaxial growth and the p-type impurity concentration is substantially constant.

In FIG. 3, the $n^+$-type source regions 108 are to a depth B1 while the n-type source regions 107 are to a depth B2. Between the depth B2 and a depth B3 is a non-doped layer, and from the depth B3 to a depth B4 is the p-type base layer 106. In the conventional silicon carbide semiconductor device depicted in FIG. 14, the $n^+$-type source regions 108 and the n-type source regions 107 are formed by epitaxial growth and therefore, the n-type impurity concentration is substantially constant. Further, the p-type base layer 106 is formed by epitaxial growth and therefore, the p-type impurity concentration is substantially constant.

Figure 4:
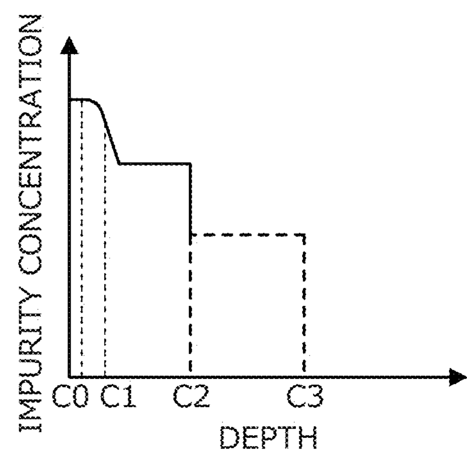
FIG. 4 is a graph of an impurity concentration profile of the portion A-A' of the silicon carbide semiconductor device according to the embodiment.

Meanwhile, FIG. 4 is a graph of an impurity concentration profile of the portion A-A' of the silicon carbide semiconductor device according to the embodiment. In FIG. 4, a horizontal axis indicates depth from the surface of the silicon carbide semiconductor base and a vertical axis is an n-type or a p-type impurity concentration, where the n-type impurity concentration is indicated by solid line and the p-type impurity concentration is indicated by a dashed line.

In FIG. 4, a depth C0 is a point where the n-type impurity concentration is greatest and C1 is a point where the n-type impurity concentration becomes half of that at C0. Further, C2 corresponds to a border between the n-type source region 7 and the p-type base layer 6, and C3 corresponds to a border between the p-type base layer 6 and the second $n^-$-type silicon carbide epitaxial layer 4. From the surface of the silicon carbide semiconductor base to the depth C1 is the $n^+$-type source regions 8; from the depth C1 to the depth C2 is the n-type source region 7; and from the depth C2 to the depth C3 is the p-type base layer 6. In the silicon carbide semiconductor device according to the embodiment, as described hereinafter, the n-type source region 7 is formed by epitaxial growth and the $n^+$-type source regions 8 are formed by ion-implanting an n-type impurity in the layer formed by epitaxial growth. Therefore, the $n^+$-type source regions 8 have a profile in which the n-type impurity concentration gradually decreases from the depth C0 to the n-type source region 7, exhibiting Gaussian distribution. The n-type source region 7 has an n-type impurity concentration that is substantially constant and the p-type base layer 6 has a p-type impurity concentration that is substantially constant.

Further, the $n^+$-type source regions 8 have a thickness w1 that may be preferably at most equal to a thickness w2 of the n-type source region 7 ($w1 \leq w2$). Damage caused by the ion implantation when the $n^+$-type source regions 8 are formed reaches a depth corresponding to about the thickness w1 of the $n^+$-type source regions 8 and therefore, by setting $w1 \leq w2$, the n-type source region 7 may absorb the damage and the damage may be prevented from reaching the p-type base layer 6. In other words, in the p-type base layer 6 facing the $n^+$-type source regions 8 in the depth direction, there is no damage caused by the ion implantation. As a result, damage due to ion implantation does not affect the channel and characteristics do not degrade. Therefore, in the silicon carbide semiconductor device, variation of the threshold voltage may be suppressed. For example, a combined thickness of one of the $n^+$-type source regions 8 and the n-type source region 7 ($w1+w2$) is in a range from 0.4 μm to 0.6 μm, and the thickness w1 of the $n^+$-type source regions 8 satisfies $w1 \leq w2$ and is in a range from 0.05 μm to 0.3 μm.

Further, a maximum impurity concentration of the $n^+$-type source regions 8 is in a range from $1.0 \times 10^{18}/cm^3$ to $5.0 \times 10^{19}/cm^3$ and preferably, may be in a range from $1.0 \times 10^{18}/cm^3$ to $3.0 \times 10^{19}/cm^3$. The impurity concentration of the n-type source region 7 that is an epitaxial layer is in a range from $1.0 \times 10^{16}/cm^3$ to $1.0 \times 10^{18}/cm^3$ and preferably, may be in a range from $0.5 \times 10^{17}/cm^3$ to $1.5 \times 10^{17}/cm^3$. The n-type source region 7 and the $n^+$-type source regions 8 are set to have such impurity concentrations, whereby variation may be suppressed without increasing the ON resistance.

Further, in the embodiment, preferably, the $p^{++}$-type contact regions 9 may have an impurity concentration that is higher than the impurity concentration of the p-type base layer 6 and in a range from $1.0 \times 10^{19}/cm^3$ to $5.0 \times 10^{20}/cm^3$. Further, preferably, the $p^{++}$-type contact regions 9 may be provided by a single stage. As a result, in the $p^{++}$-type contact regions 9, the impurity concentration thereof is higher toward the drain side, thereby enabling avalanche breakdown capability to be enhanced. Further, similarly to the source regions, the $p^{++}$-type contact regions 9 may be formed by 2 stages so that the impurity concentration at the surface is increased. In this instance, the impurity concentration suffices to be increased only at the surface and therefore, formation is easy and manufacturing throughput is enhanced.

An interlayer insulating film 13 is provided in an entire area of the front surface of the semiconductor substrate so as to cover the gate electrodes 12. In the interlayer insulating film 13, contact holes penetrating through the interlayer insulating film 13 in the depth direction y and reaching the substrate front surface are formed.

The source electrodes (first electrodes) 16 are in ohmic contact with the semiconductor substrate (the $n^+$-type source regions 8) in the contact holes opened in the interlayer insulating film 13, and are electrically insulated from the gate electrodes 12 by the interlayer insulating film 13. The source electrodes 16 are in ohmic contact with the $n^+$-type source regions 8 and the $p^{++}$-type contact regions 9. Further, between the interlayer insulating film 13 and the source electrodes 16, for example, a barrier metal (not depicted) that prevents diffusion of metal atoms from the source electrodes 16 to the gate electrodes 12 may be provided. A source electrode pad 14 is provided on the source electrodes 16. The drain electrode (second electrode) 15 constituting a drain electrode is provided on the back surface of the semiconductor substrate. A drain electrode pad (not depicted) is provided on the drain electrode 15. A barrier metal (not depicted) may be further provided between the source electrodes 16, the interlayer insulating film 13 and the source electrode pad 14.

Next, a method of manufacturing the silicon carbide semiconductor device according to the embodiment is described. FIGS. 5, 6, 7, 8, and 9 are cross-sectional views depicting states of the silicon carbide semiconductor device according to the embodiment during manufacture.

First, the $n^+$-type silicon carbide substrate 1 containing an n-type silicon carbide is prepared. Subsequently, on a first surface (front surface) of the $n^+$-type silicon carbide substrate 1, the first $n^-$-type silicon carbide epitaxial layer 2 containing silicon carbide is epitaxially grown while an n-type impurity, for example, nitrogen (N) atoms is doped.

Figure 5:
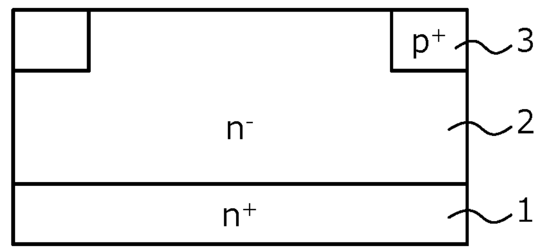
FIG. 5 is cross-sectional view depicting a state of the silicon carbide semiconductor device according to the embodiment during manufacture.

Next, on the surface of the first $n^-$-type silicon carbide epitaxial layer 2, a non-depicted ion implantation mask having predetermined openings is formed by a photolithographic technique using, for example, an oxide film. Subsequently, by an ion implantation method using the oxide film as a mask, a p-type impurity, for example, aluminum (Al) atoms is ion-implanted, whereby the first $p^+$-type regions 3 of a depth in a range from 0.3 μm to 1.0 μm and, for example, having an impurity concentration in a range from $2.0 \times 10^{17}/cm^3$ to $2.0 \times 10^{18}/cm^3$ are formed in a surface layer of the first $n^-$-type silicon carbide epitaxial layer 2. The state up to here is depicted in FIG. 5.

Next, on the surface of the first $n^-$-type silicon carbide epitaxial layer 2, the second $n^-$-type silicon carbide epitaxial layer 4 doped with an n-type impurity such as nitrogen and having a thickness in a range from 0.3 μm to 1.0 μm is formed, for example, having an impurity concentration in a range from $1.0 \times 10^{16}/cm^3$ to $5.0 \times 10^{17}/cm^3$.

Figure 6:
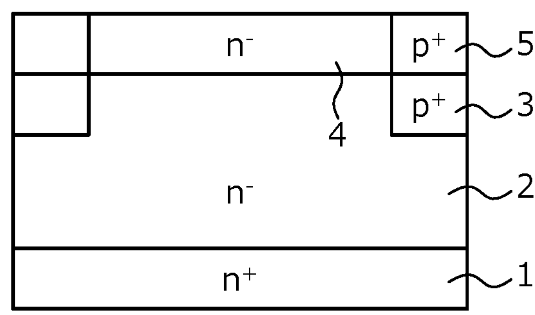
FIG. 6 is cross-sectional view depicting a state of the silicon carbide semiconductor device according to the embodiment during manufacture.

Next, on the surface of the second $n^-$-type silicon carbide epitaxial layer 4, a non-depicted ion implantation mask having predetermined openings is formed by a photolithographic technique using, for example, an oxide film. Subsequently, by an ion implantation method using the oxide film as a mask, a p-type impurity, for example, aluminum atoms are ion-implanted, whereby in a surface layer of the second $n^-$-type silicon carbide epitaxial layer 4, the second $p^+$-type regions 5 of a depth penetrating through the second $n^-$-type silicon carbide epitaxial layer 4 are formed, for example, having an impurity concentration in a range from $2.0 \times 10^{17}/cm^3$ to $2.0 \times 10^{18}/cm^3$. The state up to here is depicted in FIG. 6.

Next, on the surface of the second $n^-$-type silicon carbide epitaxial layer 4, the p-type base layer 6 is epitaxially grown, for example, having an impurity concentration in a range from $5.0 \times 10^{16}/cm^3$ to $2.0 \times 10^{18}/cm^3$. After the p-type base layer 6 is formed by epitaxial growth, a p-type impurity such as aluminum may be ion-implanted in the p-type base layer 6, in channel regions of the p-type base layer 6. Further, after the second $n^-$-type silicon carbide epitaxial layer 4 is epitaxially grown, the p-type base layer 6 may be formed by ion-implantation of a p-type impurity such as aluminum.

Next, on the surface of the p-type base layer 6, the n-type source region 7 having a thickness of about 0.5 μm is epitaxially grown having, for example, an impurity concentration of $1.0\times10^{17}/cm^3$. After the n-type source region 7 is formed by epitaxial growth, an n-type impurity such as phosphorus (P) or nitrogen is ion-implanted at the surface of the n-type source region 7, whereby in a surface layer of the n-type source region 7, the $n^+$-type source regions 8 are formed having, for example, an impurity concentration of $3.0\times10^{19}/cm^3$. At this time, the $n^+$-type source regions 8 are formed so that the thickness thereof is less that the thickness of the n-type source region 7 of a portion between the p-type base layer 6 and the $n^+$-type source regions 8. As a result, damage due to the ion implantation does not remain in the p-type base layer 6. Further, the $n^+$-type source regions 8 may be selectively formed by an ion implantation method that uses a mask having predetermined openings formed on the n-type source region 7 and constituted by an oxide film.

Figure 7:
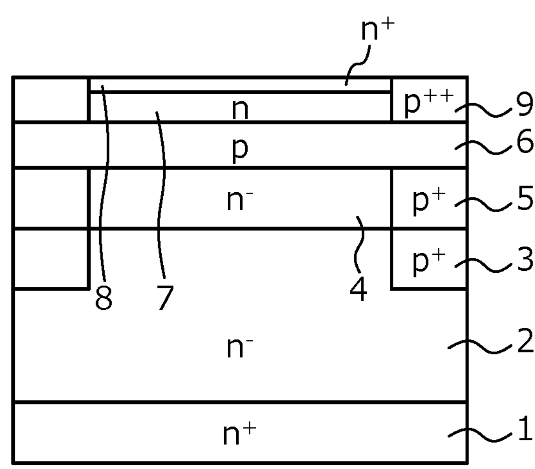
FIG. 7 is cross-sectional view depicting a state of the silicon carbide semiconductor device according to the embodiment during manufacture.

Next, a non-depicted ion implantation mask having predetermined openings is formed using, for example, an oxide film. Subsequently, by an ion implantation method using the oxide film as a mask, a p-type impurity, for example, aluminum atoms are ion-implanted, whereby in portions of the n-type source region 7 and portions of the $n^+$-type source regions 8, the $p^{++}$-type contact regions 9 are formed so as to have, for example, an impurity concentration of $1.0\times10^{20}/cm^3$. Preferably, the $p^{++}$-type contact regions 9 may be formed so that the impurity concentration thereof is higher than the impurity concentration of the p-type base layer 6 and is in a range from $1.0\times10^{19}/cm^3$ to $5.0\times10^{20}/cm^3$. The $p^{++}$-type contact regions 9 are formed so that bottoms thereof reach the p-type base layer 6. The state up to here is depicted in FIG. 7.

In this manner, in the embodiment, damage due to the ion implantation of the $n^+$-type source regions 8 does not remain in the p-type base layer 6 and therefore, variation of the threshold voltage may be reduced. Further, the channel layer is determined by the p-type base layer 6 that is formed by thin-thickness epitaxial growth and therefore, variation of the channel length remains low. Further, variation of impurity concentration due to ion implantation is small at about 3% and therefore, variation of the impurity concentration of the $n^+$-type source regions 8 may be reduced, variation of contact resistance may be suppressed, and an evaluation of quality is unnecessary. Further, there is no epitaxial growth of a high impurity concentration and therefore, epitaxial growth equipment is not affected.

Next, on the surfaces of the $n^+$-type source regions 8, a trench formation mask having predetermined openings is formed by photolithography using, for example, an oxide film. Next, the trenches 10 that penetrate through the $n^+$-type source regions 8, the n-type source region 7, and the p-type base layer 6 and reach the second $n^-$-type silicon carbide epitaxial layer 4 are formed by dry etching. Next, the trench formation mask is removed.

Figure 8:
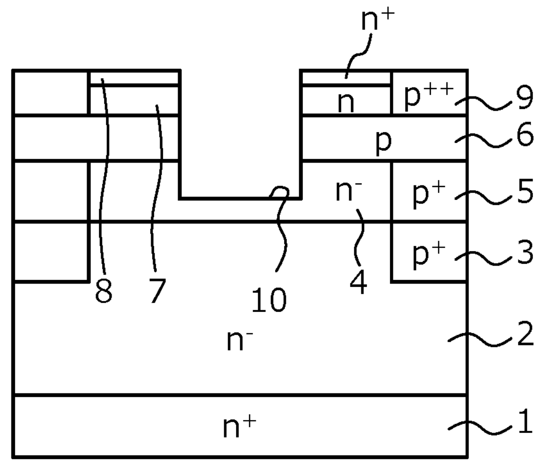
FIG. 8 is cross-sectional view depicting a state of the silicon carbide semiconductor device according to the embodiment during manufacture.

Next, under an inert gas atmosphere of about 1750 degrees C., a heat treatment (annealing) is performed, whereby an activation treatment for the first $p^+$-type regions 3, the second $p^+$-type regions 5, the $n^+$-type source regions 8, and the $p^{++}$-type contact regions 9 is implemented. As described above, ion implanted regions may be collectively activated by a single heat treatment or the implanted regions may be activated by performing the heat treatment each time ion implantation is performed. The state up to here is depicted in FIG. 8.

Next, on the surfaces of the $n^+$-type source regions 8 and the surfaces of the $p^{++}$-type contact regions 9, and along the bottoms and the sidewalls of the trenches 10, the gate insulating films 11 are formed. The gate insulating films 11 may be formed by thermal oxidation of a temperature of about 1300 degrees C. under an oxygen atmosphere. Further, the gate insulating films 11 may be formed by a deposition method by a chemical reaction such as that for a high temperature oxide (HTO).

Next, on the gate insulating films 11, a polycrystalline silicon film doped with, for example, phosphorus atoms, is provided. The polycrystalline silicon film may be formed so as to be embedded in the trenches 10. The polycrystalline silicon film is patterned by photolithography and left in the trenches 10, whereby the gate electrodes 12 are formed. For the gate electrodes 12, a p-type polycrystalline silicon film may be used.

Figure 9:
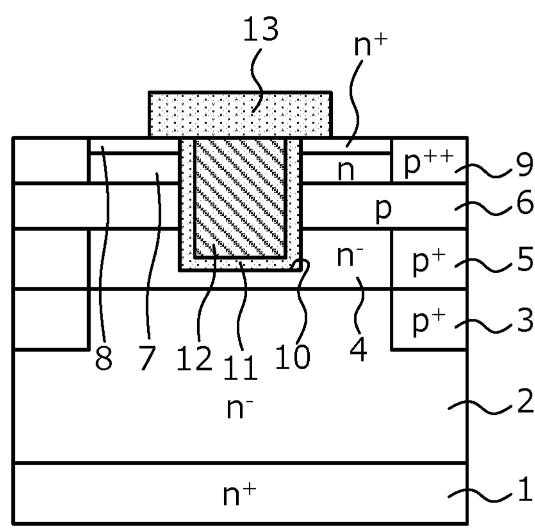
FIG. 9 is cross-sectional view depicting a state of the silicon carbide semiconductor device according to the embodiment during manufacture.

Next, for example, phosphate glass is deposited to have a thickness of about 1 μm and so as to cover the gate insulating films 11 and the gate electrodes 12, whereby the interlayer insulating film 13 is formed. The interlayer insulating film 13 and the gate insulating films 11 are patterned by photolithography, whereby contact holes exposing the $n^+$-type source regions 8 and the $p^{++}$-type contact regions 9 are formed. The state up to here is depicted in FIG. 9.

Next, in the contact holes provided in the interlayer insulating film 13 and on the interlayer insulating film 13, a conductive film constituting the source electrodes 16 is formed. The conductive film, for example, is a nickel (Ni) film. Thereafter, for example, a heat treatment performed at a temperature of about 700 degrees C. is performed and the conductive film and silicon carbide selectively react with each other, subsequently unreacted portions of the conductive film are selectively removed, leaving only the source electrodes 16 in the contact holes, whereby the $n^+$-type source regions 8 and the $p^{++}$-type contact regions 9 are in contact with the source electrodes 16.

Next, for example, by a sputtering method, on the source electrodes 16 of the front surface of the silicon carbide semiconductor base and on the interlayer insulating film 13, a metal layer constituting the source electrode pad 14 is deposited. At this time, the barrier metal (not depicted) containing titanium or titanium nitride may be formed first. A thickness of the metal layer on the interlayer insulating film 13, for example, may be 5.5 μm. The metal layer, for example, may be formed using aluminum (Al—Si) containing silicon at a rate of 1%. Next, the metal layer is selectively removed, whereby the source electrode pad 14 is formed.

Next, on a second surface (back surface) of the $n^+$-type silicon carbide substrate 1, a conductive film constituting the drain electrode 15, for example, a molybdenum film and a nickel film are successively deposited by, for example, a sputtering method. Thereafter, a heat treatment such as laser annealing is performed, whereby the $n^+$-type silicon carbide substrate 1 and conductive film react with each other, thereby forming the drain electrode.

Next, on the surface of the drain electrode 15, titanium, nickel, and gold are sequentially deposited as the drain electrode pad (not depicted). In this manner, the trench-type MOSFET 70 depicted in FIG. 1 is completed.

Figure 10:
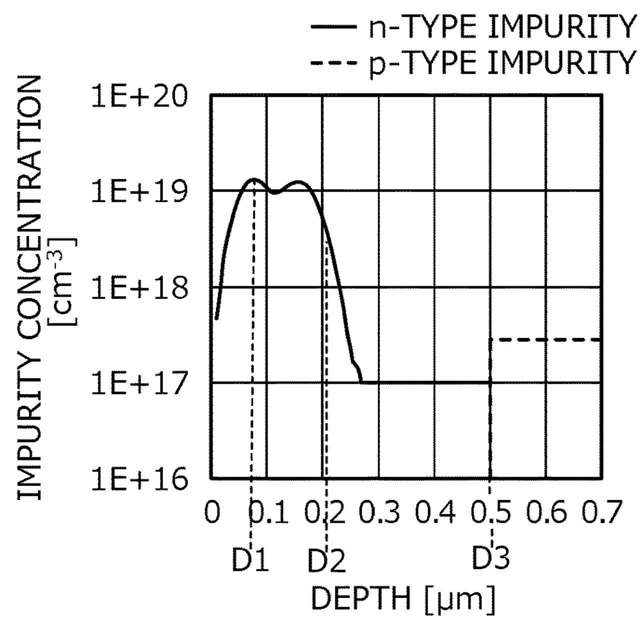
FIG. 10 is a graph depicting measurement results of the impurity concentration of the portion A-A' of the silicon carbide semiconductor device according to the embodiment depicted in FIG. 1.

Here, FIG. 10 is a graph depicting measurement results of the impurity concentration of the portion A-A' of the silicon carbide semiconductor device according to the embodiment depicted in FIG. 1. In FIG. 10, a horizontal axis indicates depth from the surface of the silicon carbide semiconductor base in units of μm. A vertical axis indicates an n-type or a p-type impurity concentration in units of $cm^{-3}$.

In FIG. 10, a depth D1 is a point where the n-type impurity concentration is greatest and D2 is a point where the n-type impurity concentration becomes ½ of that at D1. Further, D3 corresponds to a border between the n-type source region 7 and the p-type base layer 6. From the surface of the silicon carbide semiconductor base to the depth D2 (about 0.2 μm) is the $n^+$-type source regions 8, to a depth D3 (about 0.5 μm) is the n-type source region 7; and beyond the depth D3 is the p-type base layer 6. As depicted in FIG. 10, the $n^+$-type source regions 8 have a profile in which the n-type impurity concentration gradually decreases from the depth D1 (about 0.17 μm) to the n-type source region 7. For example, from the depth D1 to about 0.1 μm, the impurity concentration sharply decreases from $1.0\times10^{19}/cm^3$ to $1.0\times10^{17}/cm^3$, exhibiting Gaussian distribution. The n-type impurity concentration of the n-type source region 7 is substantially constant and the p-type impurity concentration of the p-type base layer 6 is substantially constant.

Figure 11:
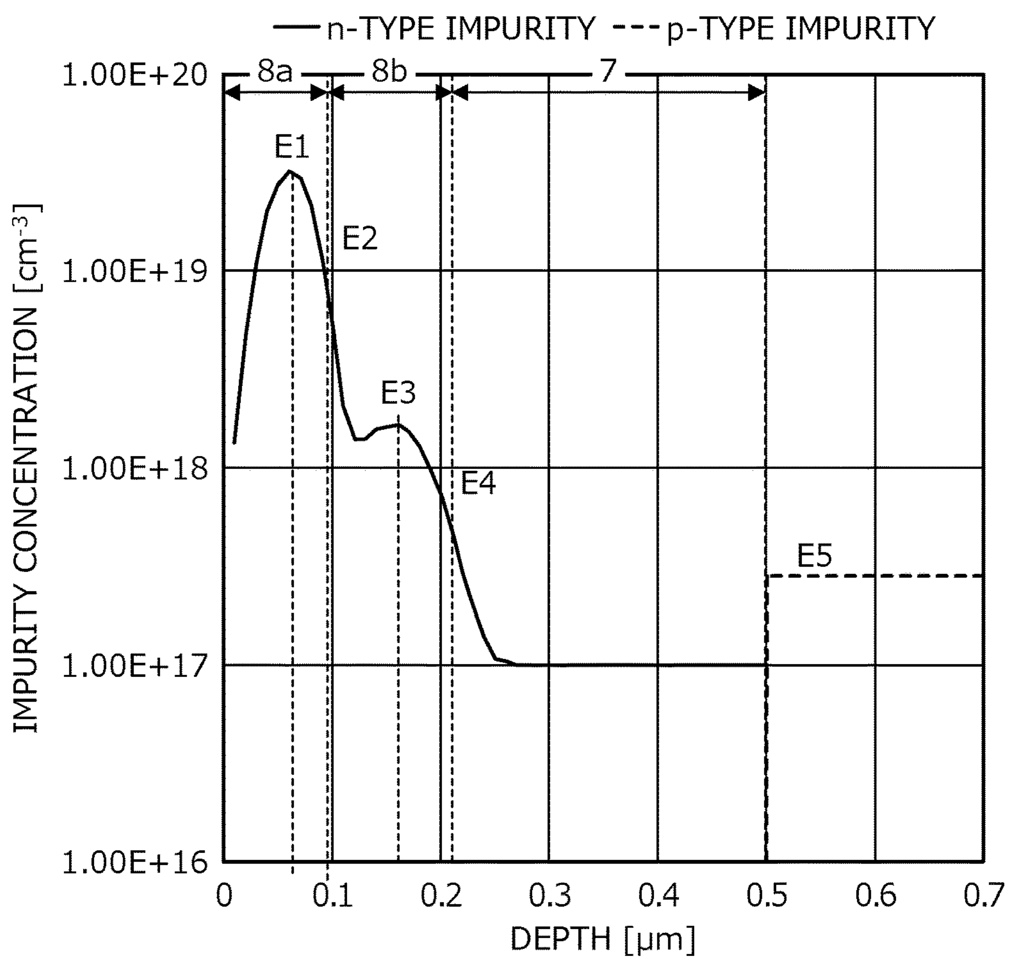
FIG. 11 is another graph depicting measurement results of the impurity concentration of the portion A-A' of the silicon carbide semiconductor device according to the embodiment depicted in FIG. 1.

FIG. 11 is an example in which each of the $n^+$-type source regions 8 is constituted by two layers including a high-concentration portion 8*a* facing the surface and a low-concentration portion 8*b* facing the n-type source region 7. A depth E1 is a point where in the n-type impurity concentration is greatest in the high-concentration portion 8*a* and E2 is a point where the n-type impurity concentration becomes ½ of that at E1. A depth E3 is a point where the n-type impurity concentration is a maximum in the low-concentration portion 8 and E4 is a point where the n-type impurity concentration becomes ½ of that at E3. Further, E5 corresponds to a border between the n-type source region 7 and the p-type base layer 6. From the surface of the silicon carbide semiconductor base to the depth E2 is the high-concentration portion 8*a*, and from the depth E2 to the depth E4 is the low-concentration portion 8*b*. From the depth E4 to the depth E5 (about 0.5 μm) is the n-type source region 7 and beyond the depth E5 is the p-type base layer 6. As depicted in FIG. 11, the depth of E2 the high-concentration portion 8*a* is at most 0.1 μm. Further, the depth E4 of the low-concentration portion 8*b* is about 0.21 μm and greater than a thickness of the high-concentration portion. The impurity concentration at E1 in the high-concentration portion 8*a* may be in a range from $5.0\times10^{18}/cm^3$ to $5.0\times10^{19}/cm^3$; the impurity concentration at E3 in the low-concentration portion 8*b* may be in a range from $1.0\times10^{18}/cm^3$ to $5.0\times10^{18}/cm^3$. Further, the $n^+$-type source regions 8 have a profile in which the n-type impurity concentration gradually decreases from the depth E3 (about 0.16 μm) to the n-type source region 7. For example, from the depth E3 to about 0.1 μm, the impurity concentration sharply decreases from $1.0\times10^{18}/cm^3$ to $1.0\times10^{17}/cm^3$. The n-type impurity concentration of the n-type source region 7 is substantially constant and the p-type impurity concentration of the p-type base layer 6 is substantially constant. In this manner, configuration is such that each of the $n^+$-type source regions 8 is constituted by two layers and has the low-concentration portion facing the n-type source region 7, whereby damage to the p-type base layer 6 due to the ion implantation may be suppressed to a minimum while the contact resistance is maintained low.

Figure 12:
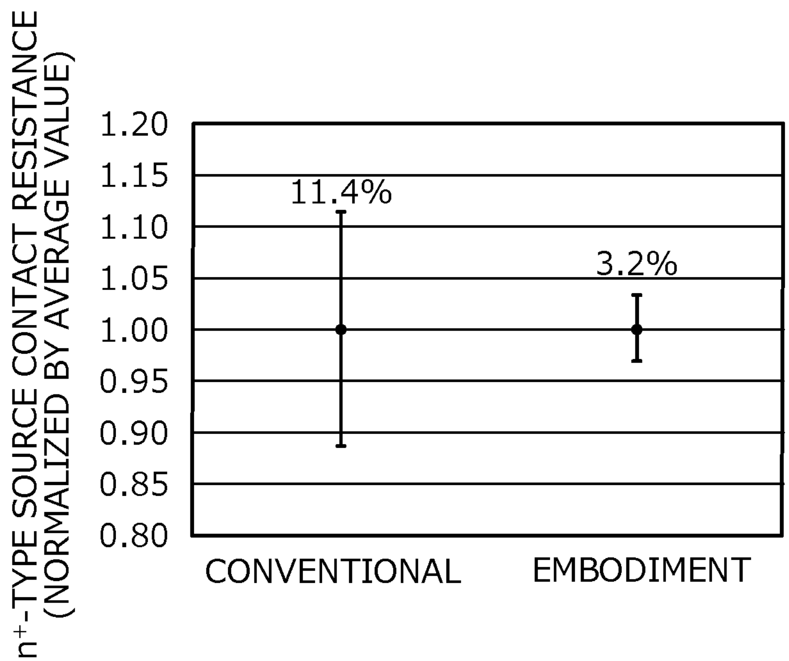
FIG. 12 is a graph depicting measurement results of contact resistance in the silicon carbide semiconductor device according to the embodiment and the conventional silicon carbide semiconductor device.

FIG. 12 is a graph depicting results of measurement of contact resistance in the silicon carbide semiconductor device according to the embodiment and the conventional silicon carbide semiconductor device. In FIG. 12, a vertical axis shows, as an error bar, the standard deviation of a result of normalizing the contact resistance of the $n^+$-type source regions 8 by the average value. The conventional silicon carbide semiconductor device of FIG. 12 is a silicon carbide semiconductor device having the structure of FIG. 14 in which the $n^+$-type source regions 8 are formed by epitaxial growth.

As depicted in FIG. 12, in the silicon carbide semiconductor device according to the embodiment, the $n^+$-type source regions 8 are formed by ion implantation, whereby variation (standard deviation) of the contact resistance may be reduced from 11.4% to 3.2%.

As described above, according to the embodiment, the n-type source region is formed by epitaxial growth and the $n^+$-type source regions are formed by ion implantation in the n-type source region at the surface of the n-type source region. Therefore, the $n^+$-type source regions have a profile in which the n-type impurity concentration gradually decreases closer to the n-type source region. The ion implantation of the $n^+$-type source regions is performed such that damage caused by the ion implantation does not remain in the p-type base layer, whereby variation of the threshold voltage may be reduced. The channel layer is determined by the p-type base layer formed by epitaxial growth for a thin film thickness, whereby variation of the channel length is low and since the $n^+$-type source regions are formed by ion implantation, variation of the impurity concentration of the $n^+$-type source regions may be reduced and variation of the contact resistance may be suppressed.

In the foregoing, the present invention may be variously changed within a range not departing from the spirit of the invention, and in the embodiments described above, for example, dimensions, impurity concentration, etc. of parts are variously set according to necessary specifications. Further, in the embodiments described above, while an instance in which silicon carbide is used as a wide band gap semiconductor is described as an example, other than silicon carbide, application is possible to, for example, a wide band gap semiconductor such as gallium nitride (GaN). Application is further possible to a semiconductor other than silicon (Si) or a wide band gap semiconductor such as germanium (Ge). Further, in the embodiments, while the first conductivity type is assumed to be an n-type and the second conductivity type is assumed to be a p-type, the present invention is similarly implemented when the first conductivity type is a p-type and the second conductivity type is an n-type.

According to the present invention described above, the n-type source region (third semiconductor layer) is formed by epitaxial growth and the $n^+$-type source regions (first semiconductor regions) are formed by ion implantation. Therefore, the $n^+$-type source regions have a profile in which the n-type impurity concentration thereof gradually decreases closer to the n-type source region. The channel layer is determined by the p-type base layer (second semiconductor layer) formed by epitaxial growth for a thin film thickness and therefore, variation of the channel length is low and since the $n^+$-type source regions are formed by ion implantation, variation of the impurity concentration of the $n^+$-type source regions may be reduced and variation of the contact resistance may be suppressed.

The silicon carbide semiconductor device and the method of manufacturing a silicon carbide semiconductor device according to the present invention achieve an effect in that variation of the ON resistance may be suppressed without increasing the amount that the threshold voltage varies.

As described above, the silicon carbide semiconductor device and the method of manufacturing a silicon carbide semiconductor device according to the present invention are useful for power semiconductor devices used in power converting equipment such as inverters, power source devices such as those of various types of industrial machines, ignitors of automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:

a silicon carbide semiconductor substrate of a first conductivity type, having a first surface and a second surface opposite to each other;

a first semiconductor layer of the first conductivity type, provided on the first surface of the silicon carbide semiconductor substrate, the first semiconductor layer having an impurity concentration lower than an impurity concentration of the silicon carbide semiconductor substrate, the first semiconductor layer having a first surface and a second surface opposite to each other, the second surface of the first semiconductor layer facing the silicon carbide semiconductor substrate;

a second semiconductor layer of a second conductivity type, provided on the first surface of the first semiconductor layer, the second semiconductor layer having a first surface and a second surface opposite to each other, the second surface of the second semiconductor layer facing the silicon carbide semiconductor substrate;

a third semiconductor layer of the first conductivity type, selectively provided at the first surface of the second semiconductor layer, the third semiconductor layer having a first surface and a second surface opposite to each other, the second surface facing the silicon carbide semiconductor substrate;

a first semiconductor region of the first conductivity type, selectively provided at the first surface of the third semiconductor layer;

a second semiconductor region of the second conductivity type, selectively provided in the third semiconductor layer, the second semiconductor region penetrating through the third semiconductor layer from the first surface of the third semiconductor layer, and having an impurity concentration higher than an impurity concentration of the second semiconductor layer;

a trench penetrating through the first semiconductor region, the second semiconductor layer, and the third semiconductor layer, and reaching the first semiconductor layer;

a gate electrode provided in the trench via a gate insulating film;

an interlayer insulating film provided on the gate electrode;

a first electrode provided on the first surface of the second semiconductor layer and a surface of the first semiconductor region; and a second electrode provided on the second surface of the silicon carbide semiconductor substrate, wherein the first semiconductor region has an impurity concentration that gradually decreases closer to the third semiconductor layer, the third semiconductor layer has an impurity concentration that is substantially constant, and the first semiconductor region is thinner than a portion of the third semiconductor layer that is between the first semiconductor region and the second semiconductor layer.

2. The silicon carbide semiconductor device according to claim 1, wherein the impurity concentration of the first semiconductor region has a maximum value in a range from $1.0\times10^{18}/cm^3$ to $5.0\times10^{19}/cm^3$.

3. The silicon carbide semiconductor device according to claim 1, wherein the third semiconductor layer has an impurity concentration that is in a range from $1.0\times10^{16}/cm^3$ to $1.0\times10^{18}/cm^3$.

4. The silicon carbide semiconductor device according to claim 1, wherein the first semiconductor region has a high-concentration portion at the first surface of the third semiconductor layer and a low-concentration portion facing the silicon carbide semiconductor substrate.

5. A method of manufacturing a silicon carbide semiconductor device, the method comprising:

preparing a silicon carbide semiconductor substrate of a first conductivity type, the silicon carbide semiconductor substrate having a first surface and a second surface opposite to each other, and forming a first semiconductor layer of the first conductivity type on the first surface of the silicon carbide semiconductor substrate, the first semiconductor layer having an impurity concentration that is lower than an impurity concentration of the silicon carbide semiconductor substrate, the first semiconductor layer having a first surface and a second surface opposite to each other, the second surface of the first semiconductor layer facing the silicon carbide semiconductor substrate;

forming a second semiconductor layer of a second conductivity type on the first surface of the first semiconductor layer, the second semiconductor layer having a first surface and a second surface opposite to each other, the second surface of the second semiconductor layer facing the silicon carbide semiconductor substrate;

forming, by epitaxial growth, a third semiconductor layer of the first conductivity type at the first surface of the second semiconductor layer, the third semiconductor layer having a first surface and a second surface opposite to each other, the second surface of the third semiconductor layer facing the silicon carbide semiconductor substrate;

selectively forming a first semiconductor region of the first conductivity type by implanting an impurity of the first conductivity type at the first surface of the third semiconductor layer;

implanting an impurity of the second conductivity type at the first surface of the third semiconductor layer to thereby selectively form a second semiconductor region of the second conductivity type, the second semiconductor region penetrating through the third semiconductor layer and having an impurity concentration higher than an impurity concentration of the second semiconductor layer;

forming a trench penetrating through the first semiconductor region, the second semiconductor layer, and the third semiconductor layer, and reaching the first semiconductor layer;

forming a gate electrode in the trench via a gate insulating film;

forming an interlayer insulating film on the gate electrode;

forming a first electrode on the first surface of the second semiconductor layer and a surface of the first semiconductor region; and forming a second electrode on the second surface of the silicon carbide semiconductor substrate, wherein the first semiconductor region has an impurity concentration that gradually decreases closer to the third semiconductor layer, the third semiconductor layer has an impurity concentration that is substantially constant, and the first semiconductor region is formed to be thinner than a portion of the third semiconductor layer that is between the first semiconductor region and the second semiconductor layer.

6. The method according to claim 5, wherein forming the first semiconductor region includes implanting phosphorus or nitrogen as the impurity of the first conductivity type.

7. The method according to claim 5, wherein forming the first semiconductor region includes forming the first semiconductor region so that a maximum impurity concentration of the first semiconductor region is in a range from $1.0\times10^{18}/cm^3$ to $5.0\times10^{19}/cm^3$.

8. The method according to claim 5, wherein forming the third semiconductor layer includes forming the third semiconductor layer to have an impurity concentration that is in a range from $1.0\times10^{16}/cm^3$ to $1.0\times10^{18}/cm^3$.

9. The method according to claim 5, wherein selectively forming the first semiconductor region includes forming the first semiconductor region to have a two-layer structure including a high-concentration portion at the first surface of the third semiconductor layer and a low-concentration portion facing the silicon carbide semiconductor substrate.

* * * * *